United States Patent
Funakura et al.

(10) Patent No.: US 6,469,373 B2
(45) Date of Patent: Oct. 22, 2002

(54) SEMICONDUCTOR APPARATUS WITH IMPROVED THERMAL AND MECHANICAL CHARACTERISTIC UNDER-FILL LAYER AND MANUFACTURING METHOD THEREFOR

(75) Inventors: Hiroshi Funakura, Yokohama; Eiichi Hosomi, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/854,559

(22) Filed: May 15, 2001

(65) Prior Publication Data

US 2001/0040280 A1 Nov. 15, 2001

(30) Foreign Application Priority Data

May 15, 2000 (JP) ........................................ 2000-141301

(51) Int. Cl.$^7$ .............................................. H01L 23/02
(52) U.S. Cl. ...................................... 257/679; 257/686
(58) Field of Search ................................ 257/679, 700, 257/680, 668, 678; 438/127, 126, 122; 174/52.4; 361/760, 783; 25/840

(56) References Cited

U.S. PATENT DOCUMENTS

| | | | | |
|---|---|---|---|---|
| 5,637,916 A | * | 6/1997 | Joshi | 257/668 |
| 5,637,920 A | * | 6/1997 | Loo | 257/700 |
| 5,767,446 A | * | 6/1998 | Ha et al. | 174/52.4 |
| 5,869,886 A | * | 2/1999 | Tokuno | 257/678 |
| 5,975,408 A | | 11/1999 | Goossen | |
| 6,049,122 A | * | 4/2000 | Yoneda | 257/668 |
| 6,075,710 A | * | 6/2000 | Lau | 361/760 |
| 6,255,140 B1 | * | 3/2001 | Wang | 438/122 |
| 6,268,648 B1 | * | 7/2001 | Fukutomi et al. | 257/678 |
| 6,306,688 B1 | * | 10/2001 | Luncerford | 438/127 |
| 6,324,069 B1 | * | 11/2001 | Weber | 361/783 |
| 6,338,985 B1 | * | 1/2002 | Greenwood | 438/126 |
| 6,339,254 B1 | * | 1/2002 | Venkateshwaran et al. | 257/686 |
| 6,341,418 B1 | * | 1/2002 | Brouillette et al. | 29/840 |

FOREIGN PATENT DOCUMENTS

| | | |
|---|---|---|
| JP | 10-233463 | 9/1998 |
| JP | 11-233673 | 8/1999 |

* cited by examiner

Primary Examiner—David Nelms
Assistant Examiner—Thinh Nguyen
(74) Attorney, Agent, or Firm—Finnegan, Henderson, Farabow, Garrett & Dunner, L.L.P.

(57) ABSTRACT

In a semiconductor apparatus comprising a semiconductor chip, a wiring substrate having the semiconductor chip mounted thereon, an under-fill resin sheet interposed between the semiconductor chip and the wiring substrate, and a resin sealing body for sealing the semiconductor chip, the under-fill resin sheet and the wiring substrate, the under-fill resin sheet is greater than the semiconductor chip in size, and its end is exposed from at least one side face of the resin sealing body. Since an end of the under-fill resin sheet is exposed from at least one side face of the resin sealing body, then the water contained in the under-fill resin sheet escapes from an exposed end of the under-fill resin sheet to the outside of the resin sealing body, thus making it possible to improve re-flow resistance of the semiconductor apparatus.

49 Claims, 9 Drawing Sheets

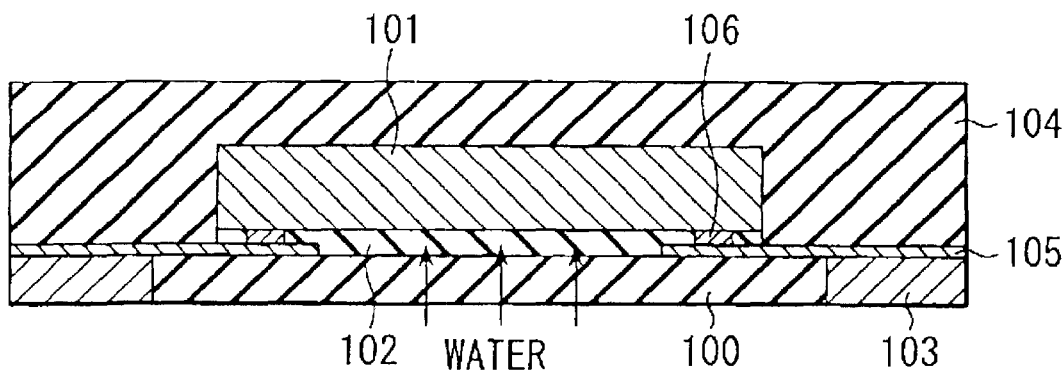
FIG. 12 (PRIOR ART)
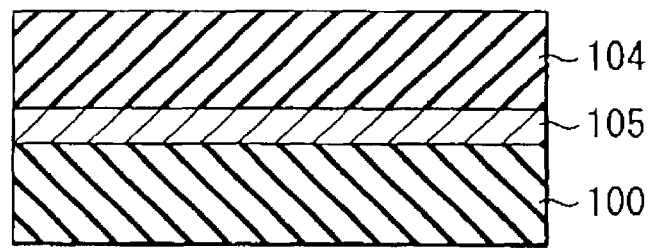
FIG. 13
(PRIOR ART)
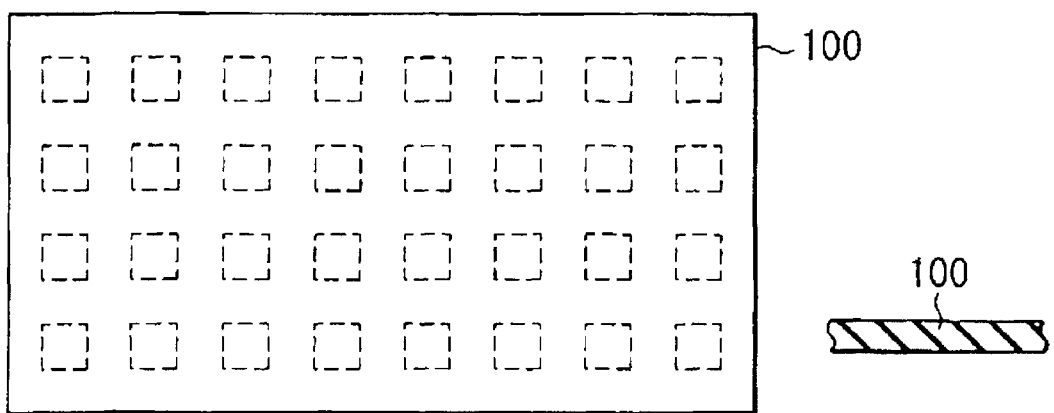
FIG. 14A
(PRIOR ART)
FIG. 14B
(PRIOR ART)

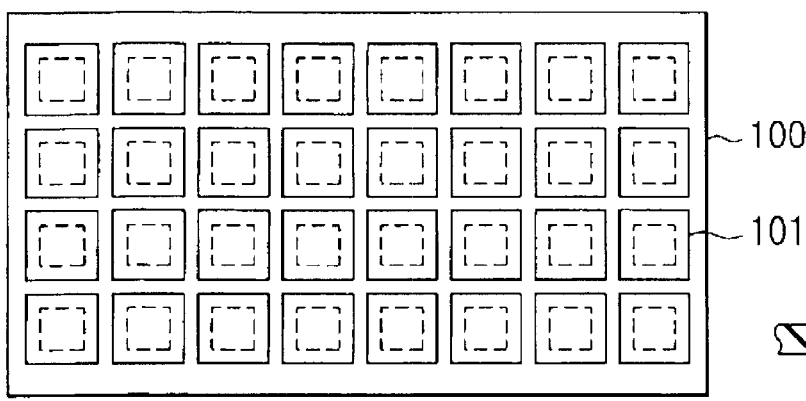
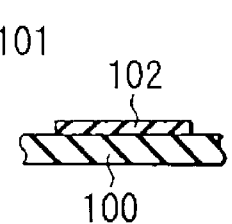
FIG. 15A (PRIOR ART)  FIG. 15B (PRIOR ART)
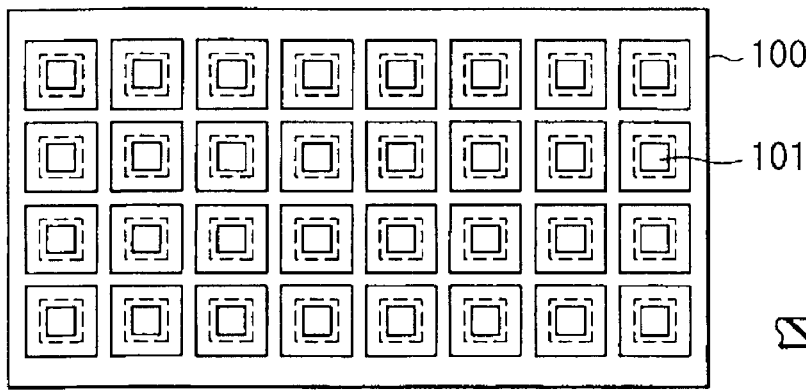
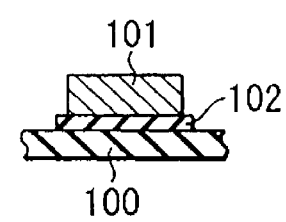
FIG. 16A (PRIOR ART)  FIG. 16B (PRIOR ART)
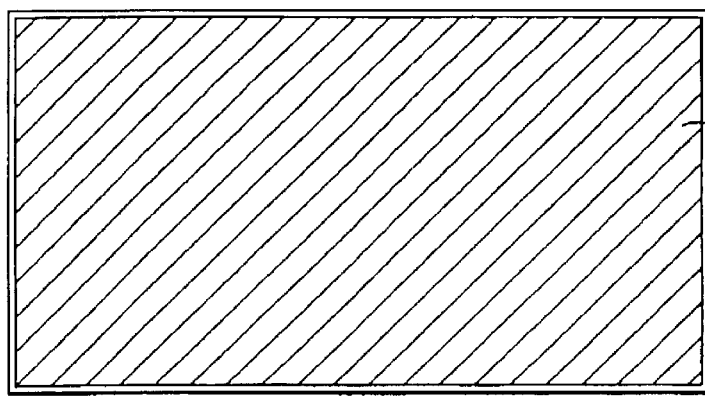
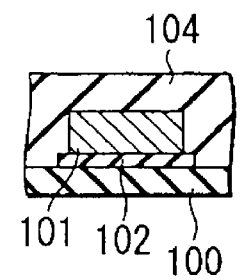
FIG. 17A (PRIOR ART)  FIG. 17B (PRIOR ART)

SEMICONDUCTOR APPARATUS WITH IMPROVED THERMAL AND MECHANICAL CHARACTERISTIC UNDER-FILL LAYER AND MANUFACTURING METHOD THEREFOR

CROSS-REFERENCE TO RELATED APPLICATIONS

This application is based upon and claims the benefit of priority from the prior Japanese Patent Application No. 2000-141301, filed May 15, 2000, the entire contents of which are incorporated herein by reference.

BACKGROUND OF THE INVENTION

The present invention relates to a semiconductor apparatus, and in particular, to a package having an under-fill resin sheet interposed between a wire substrate and a semiconductor chip.

A semiconductor apparatus is of such a type that has a semiconductor package in which a wiring substrate mounting a semiconductor chip is resin sealed with a mold resin. FIG. 10 is a sectional view of a package (CSP: Chip Size (Scale) Package) of a flip chip connection type having a conventional structure.

As a wiring substrate, there is employed an interposer made of a polyimide film (insulation film). A wiring layer 105 such as Cu is provided on a surface of a polyimide film 100. A chip 101 is disposed on the polyimide film 100, and is flip-chip connected to the polyimide film 100. That is, a connection electrode 106 that is formed on a lower face of the chip 101, and is electrically connected to its inside circuit (not shown) is connected to a wiring layer 105 formed on the surface of the polyimide film 100. An under-fill resin sheet 102 made of an epoxy resin or the like is provided between the chip 101 and the polyimide film 100, and a space between them is sealed from the outside. A resin sealing body 104 made of a mold resin such as epoxy resin is provided all over the chip, and the entire chip is sealed from the outside. That is, the resin sealing body 104 made of a mold resin is provided on the chip 101 and on the filling resin sheet 102, and the entire chip is sealed from the outside.

A laminate body made of the polyimide film 100, under-fill resin sheet 102, chip 101, and resin sealing body 104, that is, a package, is mounted on a mount substrate 107. When the package is mounted on the mount package 107, a wiring layer 105 formed on the surface of the polyimide film 100 is connected to a wiring layer 108 such as Cu formed on the surface of the mount substrate 107 via an external terminal 103 made of solder or the like provided at the periphery of the polyimide film 100.

The chip 101 and under-fill resin sheet film 102 are substantially identical to each other in size, and the under-fill resin sheet 102 does not protrude from a side face of the chip 101. The entire chip is sealed by the resin sealing body 104 made of a mold resin such as epoxy resin formed to be covered on the polyimide film 100. The mount height of the package is 0.5 (Max), and the thickness of the chip 101 is about 0.2 mm.

FIG. 11 is a sectional view illustrating a state in which the package of the semiconductor apparatus shown in FIG. 10 is mounted on the mount substrate 107. A terminal 103 of the polyimide film 100 is connected to a wire 108 on the mount substrate 107 (FIG. 11).

After the package of the semiconductor apparatus shown in FIG. 10 has been mounted on the mount substrate 107, a mount TCT (Temperature Cycling Test) test is carried out. When this test is carried out, a stress is experienced in the solder of the terminal 103 due to the difference in thermal expansion coefficients between the members, a crack occurs within the solder, finally resulting in electrical disconnection. In the package having a structure shown in FIG. 10, a solder portion is mainly disconnected in a comparatively small number of test cycles because the Young's modulus of mold resin is particularly high due to the difference in the thermal expansion coefficient between the mount substrate and the mold resin.

In addition, reliability tests for the semiconductor apparatus include a re-flow test for damping the package, thereby carrying out re-flow. This test is conducted to find out whether or not a reliability-error occurs in the package when re-flow is applied, due to water in the package contained when it is damped. In the package shown in FIG. 10, as shown in FIG. 12, there is no escape path through which water accumulated by the under-fill resin sheet 102 is effectively discharged to the outside during damping. Thus, when re-flow is applied, a crack occurs with the under-fill resin sheet 102, and the re-flow resistance is lowered.

In addition, in a CSP package of flip chip type, as shown in FIG. 13, a mold resin of the resin sealing body 104 is loaded on the wiring layer 105 such as Cu formed on the polyimide film 100. An adhesion between Cu and the mold resin is so lowered as to be prone to deterioration, thus causing their separation. In manufacture of the CSP package of flip chip type, the chip 101 is mounted after the under-fill resin sheet 102 has been pasted on a large polyimide film 100, and then, the entirety is resin sealed with the mold resin 104. Then, there is adopted a method for carrying out dicing cut into individual pieces in units of chip 101. When cut into individual pieces, a separation occurs between Cu and the mold resin.

FIG. 14A and FIG. 14B, FIG. 15A and FIG. 15B, FIG. 16A and FIG. 16B, and FIG. 17A and FIG. 17B are plan views and sectional views of laminate structures in manufacturing processes, for illustrating a conventional manufacturing method comprising the steps of: forming a laminate body of the polyimide film 100, under-fill resin sheet 102, chip 101, and mold resin 104, and cutting the formed laminate body along a package region, thereby forming a plurality of semiconductor apparatuses. FIG. 14B, FIG. 15B, FIG. 16B, and FIG. 17B are sectional views of one package region.

As a wiring substrate, there is employed an interposer made of the polyimide film 100. A package region is partitioned in plurality on the wiring substrate 100 having the polyimide film 100 provided on the surface (FIG. 14A). Each package region is a unit region in which one chip is mounted. Each of the under-fill resin sheets 102 is mounted on each package region of the polyimide film 100 (FIG. 14B). Next, one chip 101 is disposed on each under-fill resin sheet 102, and is pasted by thermal pressure welding (FIG. 15A). Next, the entirety of the polyimide film 100 is covered with the mold resin 104 (FIG. 15B). Then, a laminate body of the polyimide film 100, under-fill resin sheet 102, chip 101, and mold resin 104 is cut into individual pieces along individual package regions, thereby forming a plurality of semiconductor apparatuses shown in FIG. 10.

BRIEF SUMMARY OF THE INVENTION

The present invention has been made in view of such circumstances. It is an object of the present invention to provide a semiconductor apparatus having a chip mounted on a wiring substrate via an under-fill resin sheet, the semiconductor apparatus being resin sealed with a resin sealing body, wherein a stress applied to a solder terminal formed on the wiring substrate is reduced. It is another object of the present invention to improve the re-flow resistance and prevent a wire from separating from a resin sealing body by effectively exhausting water contained in an under-fill resin sheet to be used.

A semiconductor apparatus of the present invention includes a chip mounted on a wiring substrate via an under-fill resin sheet, the semiconductor apparatus being resin sealed with a resin sealing body, wherein the under-fill resin sheet is greater than the chip size, and its end is exposed from at least one side face of the resin sealing body. Since an end of the under-fill resin sheet is exposed from at least one side face of the resin sealing body, then the water contained in the under-fill resin sheet escapes from an exposed end of the under-fill resin sheet to the outside of the resin sealing body, thus making it possible to improve re-flow resistance of the semiconductor apparatus. When this under-fill resin sheet is substantially identical to the resin sealing body in size, the end of the under-fill resin sheet is exposed from all the side faces of the resin sealing body. Therefore, the water of the under-fill resin sheet escapes to the outside in sufficient quantity, thus making it possible to improve re-flow resistance more remarkably. Even if the size of the under-fill resin sheet is smaller than that of the resin sealing body, and thus, only part of the side face of the resin sealing body is exposed at the end of the under-fill resin sheet, as long as a sufficient quantity of water of the under-fill resin sheet escaping to the outside is ensured, an advantageous effect of the present invention can be attained.

In addition, an under-fill resin sheet with its smaller Young's modulus than the resin sealing body may be interposed between the resin sealing body and the wiring substrate. In this case, even if there is a difference in thermal expansion coefficient between a wire and a terminal, the stress applied to the wire and terminal is significantly reduced by the under-fill resin sheet.

According to a first aspect of the present invention, there is provided a semiconductor apparatus comprising: a semiconductor chip; a wiring substrate having the semiconductor chip mounted thereon; an under-fill resin sheet interposed between the semiconductor chip and the wiring substrate; and a resin sealing body for sealing the semiconductor chip, the under-fill resin sheet and the wiring substrate, wherein the under-fill resin sheet is greater than the semiconductor chip in size, and its end is exposed from at least one side face of the resin sealing body.

In the semiconductor apparatus according to the first aspect of the present invention, the semiconductor chip may be flip chip connected to the wiring substrate. The under-fill resin sheet may have a thermal expansion coefficient of 30 to 100 pp in a low temperature region of—55° C. and may have a Young's modulus of 1.0 to 5.4 GPa. The resin sealing body may have a thermal expansion coefficient of 10 to 18 ppm in a low temperature region of—55° C., and may have a Young's modulus of 10 to 20 GPa. A Young's modulus of the under-fill resin sheet may be smaller than that of the resin sealing body. The under-fill resin sheet may be exposed at its end from four side faces of the resin sealing body. The under-fill resin sheet may be exposed at its end from two opposite side faces of the resin sealing body, and may not be exposed from the other opposite two side faces. The wiring substrate may be made of a polyimide film. The wiring substrate may be made of glass epoxy. The under-fill resin sheet may be made of an epoxy resin. The semiconductor apparatus may further comprise a mount substrate having the semiconductor chip, the under-fill resin sheet, the wiring substrate, and the resin sealing body mounted thereon. The semiconductor apparatus may further comprise an external terminal interposed between the under-fill resin sheet and the mount substrate. The external terminal may be made of a solder. The semiconductor apparatus may comprise external terminals arranged in an area type and interposed between the under-fill resin sheet and the mount substrate. The external terminals may be made of solder.

In the semiconductor apparatus according to the first aspect of the present invention, the under-fill resin sheet may have a thermal expansion coefficient of 30 to 100 pp in a low temperature region of—55° C. and may have a Young's modulus of 1.0 to 5.4 GPa. The resin sealing body may have a thermal expansion coefficient of 10 to 18 ppm in a low temperature region of—55° C., and may have a Young's modulus of 10 to 20 GPa.

In the semiconductor apparatus according to the first aspect of the present invention, the resin sealing body may have a thermal expansion coefficient of 10 to 18 ppm in a low temperature region of—55° C., and may have a Young's modulus of 10 to 20 GPa.

In the semiconductor apparatus according to the first aspect of the present invention, a Young's modulus of the under-fill resin sheet may be smaller than that of the resin sealing body.

In the semiconductor apparatus according to the first aspect of the present invention, the under-fill resin sheet may be exposed at its end from four side faces of the resin sealing body.

In the semiconductor apparatus according to the first aspect of the present invention, the under-fill resin sheet may be exposed at its end from two opposite side faces of the resin sealing body, and may not be exposed from the other opposite two side faces.

In the semiconductor apparatus according to the first aspect of the present invention, the wiring substrate may be made of a polyimide film.

In the semiconductor apparatus according to the first aspect of the present invention, the wiring substrate may be made of glass epoxy.

In the semiconductor apparatus according to the first aspect of the present invention, the under-fill resin sheet may be made of an epoxy resin.

In the semiconductor apparatus according to the first aspect of the present invention, the semiconductor apparatus may further comprise a mount substrate having the semiconductor chip, the under-fill resin sheet, the wiring substrate, and the resin sealing body mounted thereon. The semiconductor apparatus may further comprise an external terminal interposed between the under-fill resin sheet and the mount substrate. The external terminal may be made of a solder. The semiconductor apparatus may comprise external terminals arranged in an area type and interposed between the under-fill resin sheet and the mount substrate. The external terminals may be made of solder.

In the semiconductor apparatus according to the first aspect of the present invention, the semiconductor chip may be connected to the wiring substrate by a bonding wire. The under-fill resin sheet may have a thermal expansion coefficient of 30 to 100 pp in a low temperature region of—55° C. and may have a Young's modulus of 1.0 to 5.4 GPa. The resin sealing body may have a thermal expansion coefficient of 10 to 18 ppm in a low temperature region of—55° C., and may have a Young's modulus of 10 to 20 GPa. A Young's modulus of the under-fill resin sheet may be smaller than that of the resin sealing body. The under-fill resin sheet may be exposed at its end from four side faces of the resin sealing body. The under-fill resin sheet may be exposed at its end from two opposite side faces of the resin sealing body, and may not be exposed from the other opposite two side faces. The wiring substrate may be made of a polyimide film. The wiring substrate may be made of glass epoxy. The under-fill resin sheet may be made of an epoxy resin. The semiconductor apparatus may further comprise a mount substrate having the semiconductor chip, the under-fill resin sheet, the wiring substrate, and the resin sealing body mounted thereon. The semiconductor apparatus may further comprise an external terminal interposed between the under-fill resin sheet and the mount substrate. The external terminal may be made of a solder. The semiconductor apparatus may comprise external terminals arranged in an area type and interposed between the under-fill resin sheet and the mount substrate. The external terminals may be made of solder.

According to a second aspect of the present invention, there is provided a method of manufacturing a semiconductor apparatus, comprising the steps of: providing an under-fill resin sheet on an insulation substrate that is a wiring substrate; providing a semiconductor chip on the under-fill resin sheet disposed on the insulation substrate; providing a resin sealing body on the insulation substrate so as to cover at least a part of the semiconductor chip and the under-fill resin sheet; and cutting in units of semiconductor chips a laminate body of the resin sealing body, the sheet, and the insulation substrate so that the end of the sheet is exposed from at least one side face of the resin sealing body.

In the semiconductor apparatus manufacturing method according to the second aspect of the present invention, the under-fill resin sheet may be great as compared with the semiconductor chip in size. The under-fill resin sheet may be exposed at its end from four side faces of resin sealing body. The under-fill resin sheet may be exposed at its end from opposite two side faces of the resin sealing body, and may not be exposed from the other opposite two side faces.

In the semiconductor apparatus manufacturing method according to the second aspect of the present invention, the under-fill resin sheet may be exposed at its end from four side faces of resin sealing body.

In the semiconductor apparatus manufacturing method according to the second aspect of the present invention, the under-fill resin sheet may be exposed at its end from opposite two side faces of the resin sealing body, and may not be exposed from the other opposite two side faces.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12 is a sectional view of FIG. 10 with the arrow indicating water damping;

FIG. 13 is an enlarged sectional view of a portion of a conventional semiconductor apparatus shown in FIG. 10;

FIG. 14A and FIG. 14B are a plan view and a sectional view of the conventional semiconductor apparatus shown in FIG. 10 in one manufacturing process;

FIG. 15A and FIG. 15B are a plan view and a sectional view of a conventional semiconductor apparatus shown in FIG. 10 in one manufacturing process;

FIG. 16A and FIG. 16B are a plan view and a sectional view of a conventional semiconductor apparatus shown in FIG. 10 in one manufacturing process;

FIG. 17A and FIG. 17B are a plan view and a sectional view of a conventional semiconductor apparatus shown in FIG. 10 in one manufacturing process;

DETAILED DESCRIPTION OF THE INVENTION

Hereinafter, preferred embodiments of the present invention will be described with reference to the accompanying drawings.

First, a semiconductor apparatus according to a firs t embodiment of the present invention will be described with reference to FIG. 1 to FIG. 6A and FIG. 6B.

Figure 1:
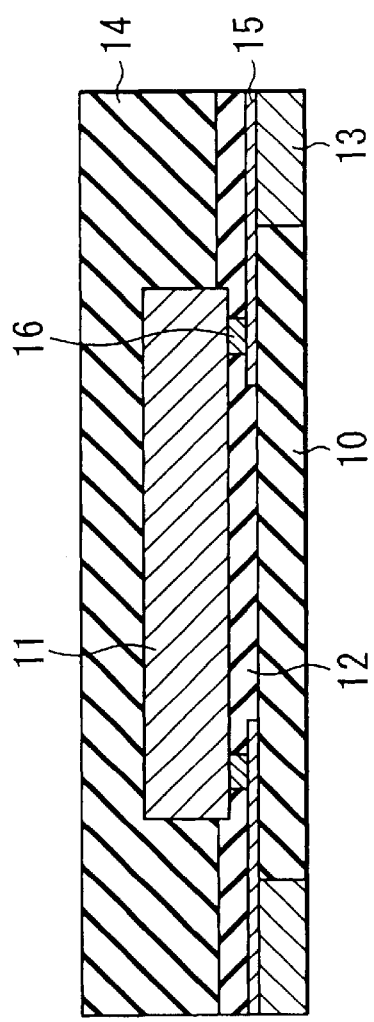
FIG. 1 is a sectional view of a semiconductor apparatus according to a first embodiment of the present invention, in particular, a CSP package of flip chip type.
Figure 2:
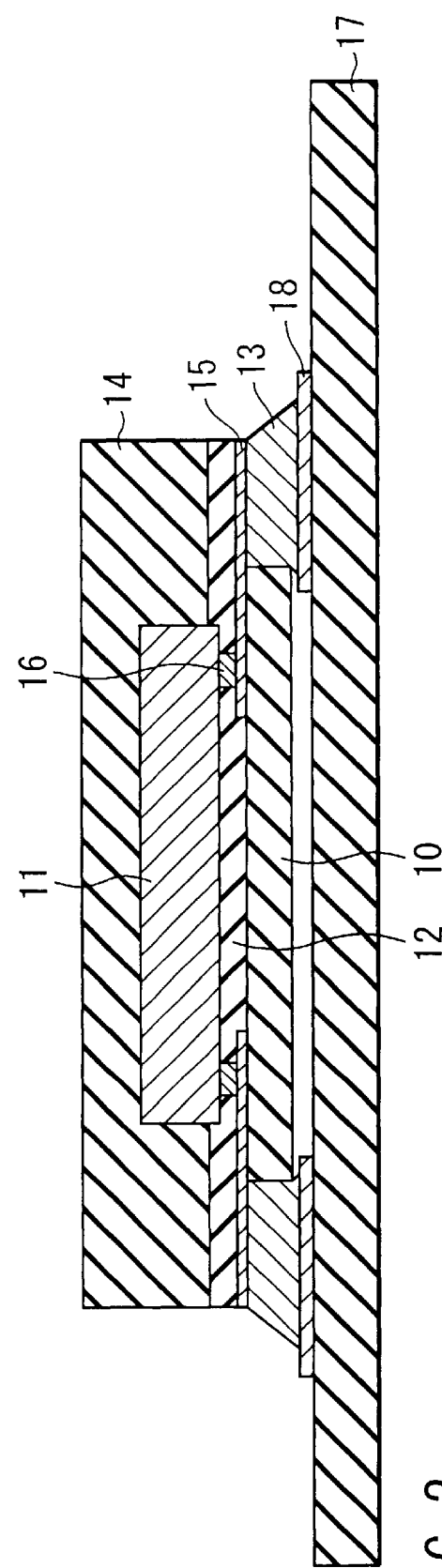
FIG. 2 is a sectional view showing a state in which the semiconductor apparatus shown in FIG. 1 is mounted on a mount substrate.
Figure 3:
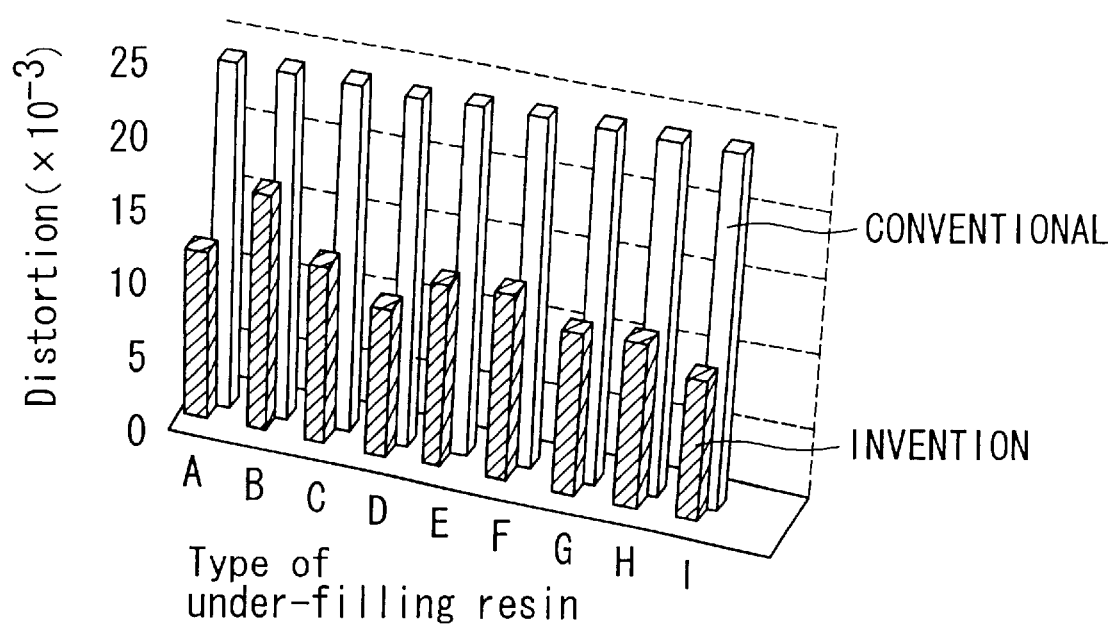
FIG. 3 is a graph showing the result obtained by computing through simulation a relationship between an under-fill resin sheet of various materials (A–I) and a distortion quantity of an external terminal, where characteristics according to the first embodiment (FIG. 1) of the present invention are shaded, and characteristics of a conventional example (FIG. 10) are unshaded.
Figure 4:
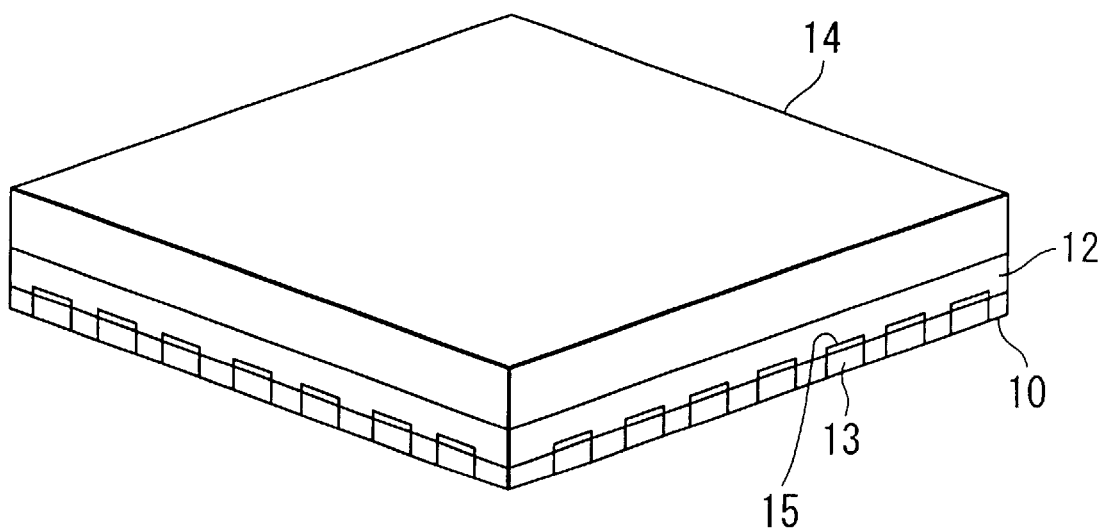
FIG. 4 is a perspective view of the semiconductor apparatus according to the present invention shown in FIG. 1.
Figure 5A:
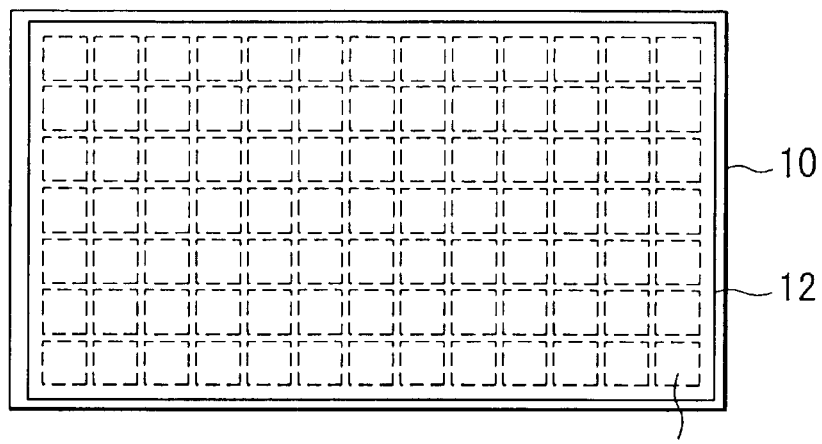
FIG. 5A, FIG. 5B, and FIG. 5C are plan views of the semiconductor apparatus according to the present invention shown in FIG. 1 in manufacturing processes.
Figure 5B:
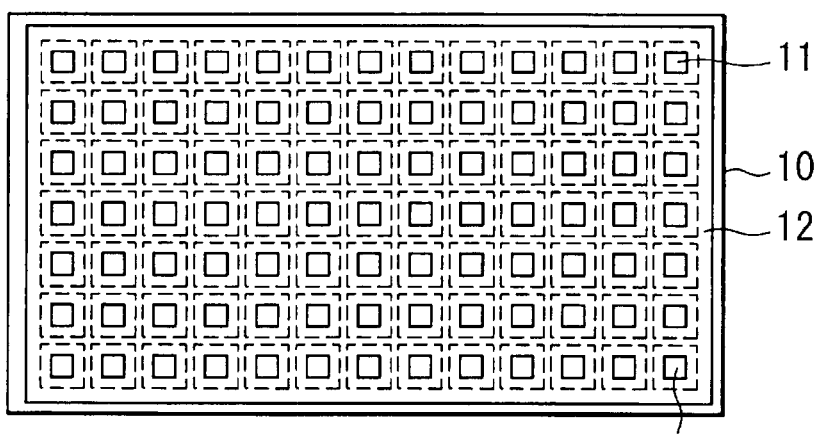
Figure 5C:
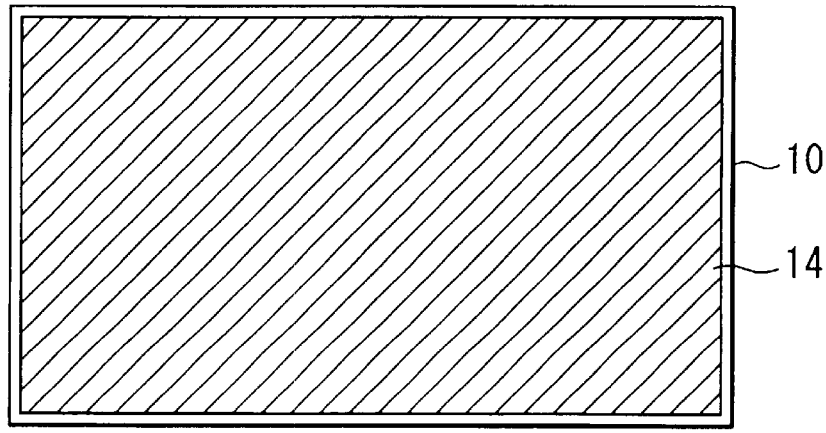
Figure 6A:
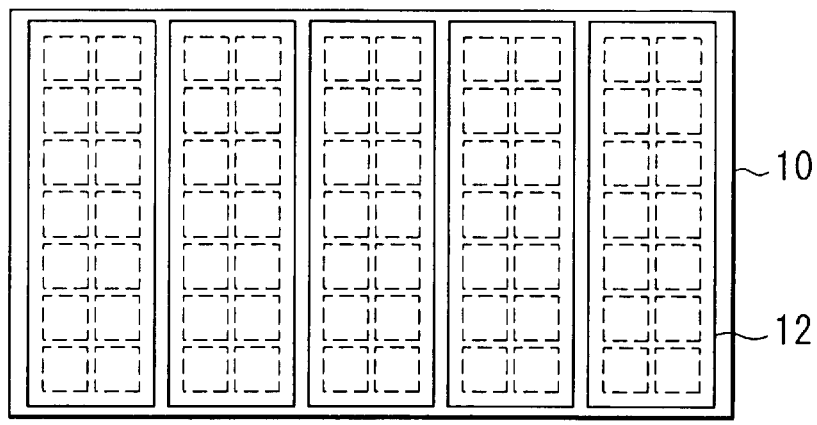
FIG. 6A and FIG. 6B are plan views showing a modified example of a polyimide film in the semiconductor apparatus according to the present invention.
Figure 6B:
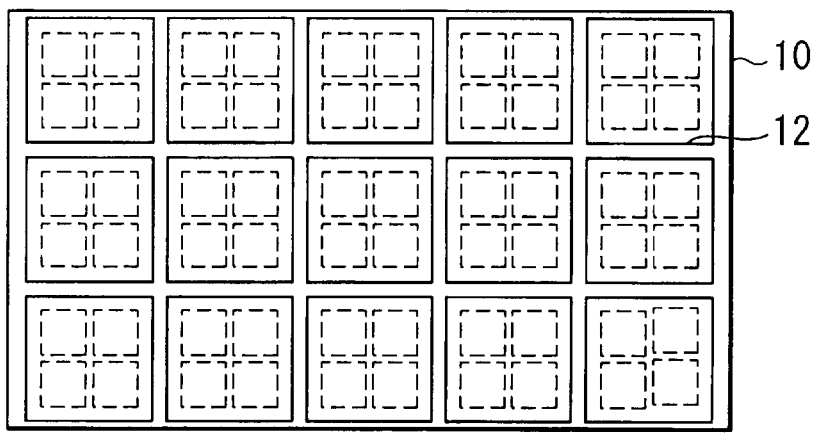

FIG. 1 is a sectional view of a semiconductor apparatus, in particular, a CSP package of flip chip type. FIG. 2 is a sectional view showing a state in which the semiconductor apparatus according to the present embodiment shown in FIG. 1 is mounted on a mount substrate 13. FIG. 3 is a graph showing the result obtained by computing through simulation a relationship between an under-fill resin sheet of various materials (A–I) and a distortion quantity of an external terminal made of solder, where characteristics according to the first embodiment (FIG. 1) of the present invention are shaded, and characteristics of a conventional example (FIG. 10) are unshaded. FIG. 4 is a perspective view of the semiconductor apparatus according to the present invention shown in FIG. 1. FIG. 5A, FIG. 5B, and FIG. 5C are plan views of the semiconductor apparatus according to the present invention shown in FIG. 1 in manufacturing processes. FIG. 6A and FIG. 6B are plan views showing a modified example of a polyimide film in the semiconductor apparatus according to the present invention.

As a wiring substrate 10, there is employed an interposer made of a polyimide film (insulation film). The wiring substrate 10 may be made of glass epoxy. A wiring layer 15 such as Cu is provided on the surface of the polyimide film 10. A chip 11 is disposed on the polyimide film 10, and is flip chip connected to the polyimide film 10. That is, a connection electrode 16 formed on the lower face of the chip 11, and electrically connected to its internal circuit (not shown) is connected to a wiring layer 15 formed on the surface of the polyimide film 10. An under-fill resin sheet 12 made of an epoxy resin is provided between the chip 11 and the polyimide film 10, and a space between them is sealed from the outside. A resin sealing body 14 made of a mold resin such as epoxy resin is provided at the entire chip, and the entire chip is sealed from the outside. That is, the resin sealing body 14 made of a mold resin is provided on the chip 11 and filling resin sheet 12, and the entire chip is sealed from the outside.

A laminate body made of the polyimide film 10, under-filling resin 12, chip 11, and resin sealing body 14, that is, a package, is mounted on a mount substance 17, as shown in FIG. 2. When the package is mounted on the mount substrate 17, the wire layer 15 formed on the surface of the polyimide film 10 is connected to a wiring layer 18 such as Cu formed on the surface of the mount substrate 17 via an external terminal 13 made of solder or the like formed at the periphery of the polyimide film 10.

The size of the under-fill resin sheet 12 provided between the chip 11 and the polyimide film 10 is greater than that of the chip 11. In addition, as described above, the entire chip is sealed with a resin sealing body 14 made of a mold resin such as epoxy resin formed to be covered on the polyimide film 10. A space between the chip 11 and the polyimide film 10 is sealed by the under-fill resin sheet 12 made of an epoxy resin or the like.

In the present embodiment, the under-fill resin sheet 12 is substantially identical to the resin sealing body 14 in size, and therefore, an end of the under-fill resin sheet 12 is exposed from each side face of the resin sealing body 14.

With respect to the physical properties of the under-fill resin sheet 12, the thermal expansion coefficient in a low temperature region of—55° C. is 30 to 100 ppm, and the Young's modulus is 1.0 to 5.4 Gpa. With respect to the physical properties of the resin sealing body 12, the thermal expansion efficient in a low temperature region of—55° C. is 10 to 18 ppm, and the Young's modules is 10 to 20 Gpa.

Electrical connection between the chip 11 and the wiring substrate 10 may be wire bonding connection, and a mold resin may be a bonding resin.

FIG. 2 is a sectional view showing a state in which a package of the semiconductor apparatus shown in FIG. 1 is mounted on a mount substrate. A terminal 13 is connected to a wire 18 on a mount substrate 17 such as printed wiring board.

The thickness of the under-fill resin sheet 12 is 30 to 80 µm when the package size is 1 to 15 mm.

Now, a method of manufacturing a semiconductor apparatus according to the present embodiment will be described here.

FIG. 5A, FIG. 5B, and FIG. 5C are plan views of a laminate structure in each manufacturing process, for illustrating a manufacturing method according to the present embodiment comprising the steps of: forming a laminate body of the polyimide film 10, under-fill resin sheet 12, chip 11, and mold resin 14, and cutting the formed laminate body along a package region, thereby forming a plurality of semiconductor apparatuses.

Each package region is a unit region for mounting one chip.

As a wiring substrate, there is employed an interposer made of a polyimide film 10. An under-fill resin sheet 12 is disposed on the polyimide film 10 (FIG. 5A). Next, the chip 11 is disposed on each package region of the under-fill resin sheet 12, and then, is pasted by thermal pressure welding (FIG. 5B). Next, the polyimide film 10 is covered with a resin sealing body 14 made of a mold resin (FIG. 5C). Then, a laminate body of the polyimide film 10, under-fill resin sheet 12, chip 11, and mold resin 14 is cut into individual pieces along individual package regions, that is, in units of chips, thereby forming a plurality of the semiconductor apparatuses shown in FIG. 1. At this time, in each of the individually-cut pieces, the under-fill resin sheet 12 is large, when compared with the chip size, and an end of the under-fill resin sheet 12 is exposed from at least one side face of the resin sealing body.

In this embodiment, one under-fill resin sheet capable of mounting a predetermined number of chips thereon is employed (FIGS. 5A and 5B). However, in the present invention, as shown in FIG. 6A and FIG. 6B, a plurality of divided under-fill resin sheets may be employed. In FIG. 6A, on the polyimide film 10, the under-fill resin sheets capable of mounting a plurality of chips thereon are pasted in plural columns in a longitudinal direction. In FIG. 6B, on the polyimide film 10, the under-fill resin sheets capable of mounting chips in units of 2×2 thereon are pasted in plural columns in longitudinal and transverse directions. Otherwise, although not shown, an under-fill resin sheet capable of mounting 3×3 chips or 2×3 chips can be employed.

In a conventional process, each of the under-fill resin sheets is pasted to each of the individual packages. In this method, the pasting time is long, and thus, the manufacturing process takes a long time. In addition, a pasting displacement of the under-fill resin sheet is as large as ±0.2 mm, and thus a package interval must be increased. This creates a problem in that only a small number of packages can be disposed in one polyimide film, and thus, manufacture efficiency is low. As in the above embodiment, one under-fill resin sheet or a plurality of divided under-fill resin sheets is/are employed. Thus, the manufacturing process is shortened, and manufacturing efficiency is improved.

Figure 10:
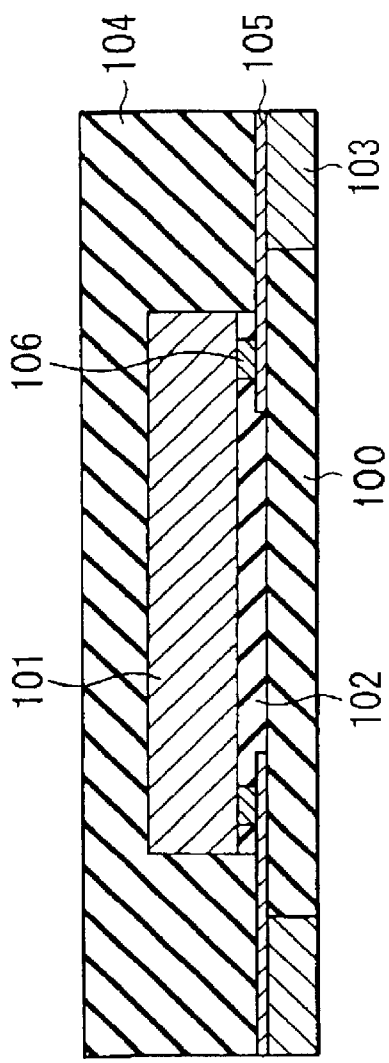
FIG. 10 is a sectional view of a conventional semiconductor device, in particular, a CSP package of flip chip type.
Figure 11:
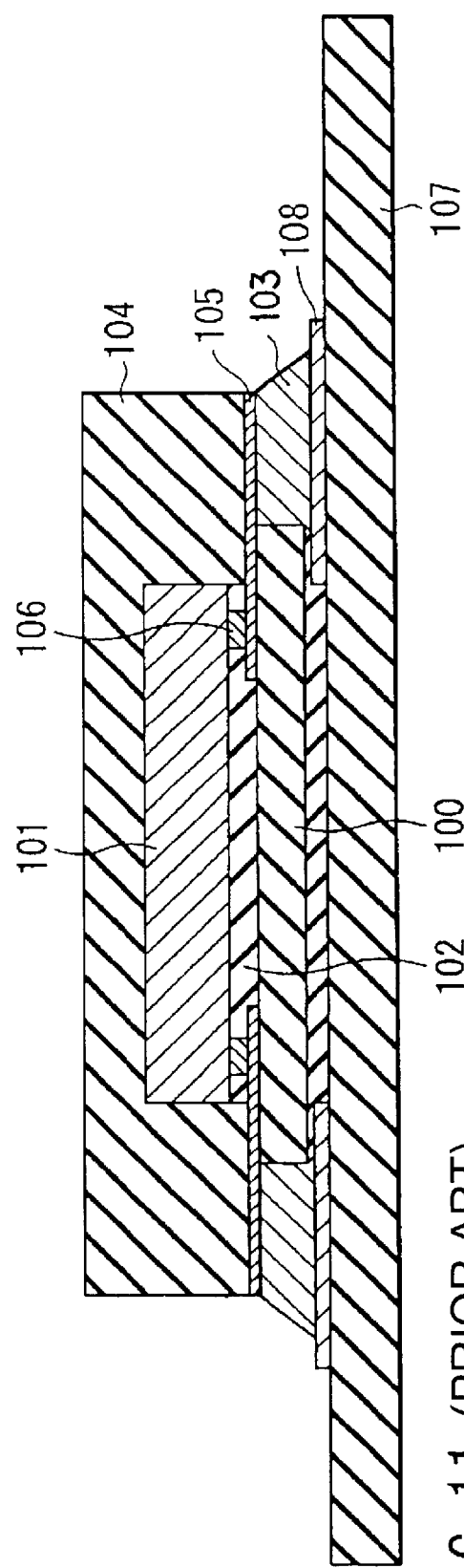
FIG. 11 is a sectional view showing a state in which a package shown in FIG. 10 is mounted on a mount substrate.

In addition, in the CSP package of conventional flip chip type shown in FIG. 10, the under-fill resin sheet is the same as the chip in size. Thus, an under-fill resin sheet 102 that reduces the stress applied to a terminal 103 is not interposed between a terminal 103 such as solder and a mold resin 104. An under-fill resin sheet 102 is not interposed between the terminal 103 and the mold resin 104. Thus, in the mount TCT test, the stress concentrates at the external terminal 103 made of solder due to the difference in thermal expansion coefficients between the mold resin 104 and the mount substrate 107, and a crack occurs with the external terminal 103. On the other hand, in the CSP package of flip chip type according to the present embodiment, the under-fill resin sheet is the same as the chip in size, and thus, an under-fill resin sheet 12 is interposed between the terminal 13 such as a solder and the mold resin 14. The under-fill resin sheet is made of a comparatively soft material having its Young's modulus of 1.0 to 6.0 GPa (at a temperature of—55° C.), and thus, serves to alleviate the stress applied to the solder, the stress being produced by deformation of a mold resin caused by thermal shrink. Therefore, in the CSP package of flip chip type according to the present embodiment, the occurrence of a crack with an external terminal 13 is inhibited.

FIG. 3 shows the result obtained when a distortion quantity in the conventional example shown in FIG. 10 ("CONVENTIONAL" in FIG. 3) and a distortion quantity in the embodiment shown in FIG. 1 ("INVENTION" in FIG. 3) are calculated through simulation. In the conventional example shown in FIG. 10, the under-fill resin sheet side is the same as the chip size. On the other hand, in the embodiment shown in FIG. 1, the under-filling sheet size is the same as the resin sealing body size (package size). In FIG. 3, quoted characters A to I indicate under-fill resin sheets of different materials. As shown in FIG. 3, even when any of the under-fill resin sheets A to I is employed, as in the embodiment shown in FIG. 1, if the under-fill resin sheet size is the same as the resin sealing body size (package size), the under-fill resin sheet size is remarkably small in distortion quantity compared to the conventional case in which the under-fill resin sheet size is the same as the chip size. For example, when an under-fill resin sheet A is employed, a distortion, when the conventional under-fill resin sheet size is the same as the chip size, is $23.63 \times 10^{-3}$. In contrast, a distortion when an under-fill resin sheet size of the present embodiment is the same as the package size, is $12.88 \times 10^{-3}$, which is about ½. That is, the conventional semiconductor apparatus is substantially $25 \times 10^{-3}$ in distortion quantity. In contrast, in the present embodiment, a distortion quantity of substantially 12 to $20 \times 10^{-3}$ is obtained.

Figure 7:
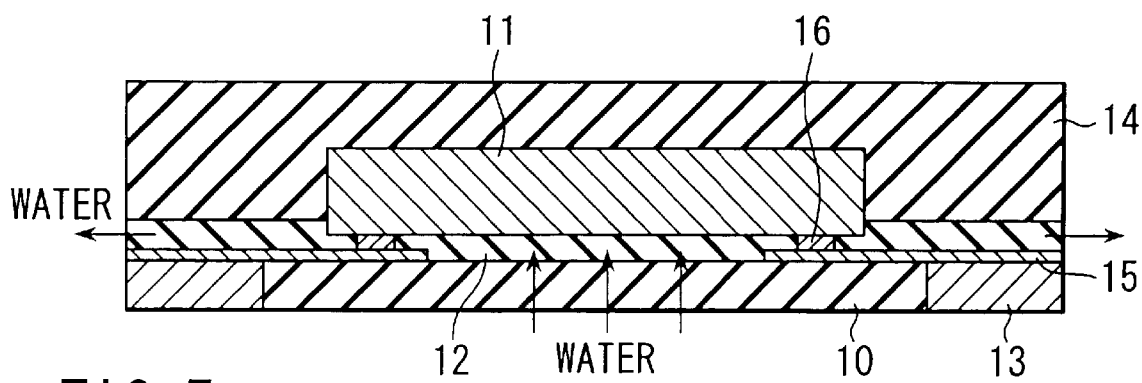
FIG. 7 is a view identical to FIG. 1 with arrows indicating water damping and discharging.

FIG. 7 is a view re-displaying a semiconductor apparatus shown in FIG. 1, for illustrating water damping and discharge. A chip 11 is mounted onto a polyimide film 10 that is a wiring substrate by means of an under-fill resin sheet 12, and electrical connection between the chip 11 and the polyimide film 10 is made by flip chip connection. The chip 11 and polyimide film 10 are sealed with a resin sealing body 14 made of a mold resin.

With respect to the physical properties of the under-fill resin sheet 12, the thermal expansion coefficient in a low temperature region of—55° C. is 30 to 100 ppm, and the Young's modulus is 1.0 to 5.4 GPa. With respect to the physical properties of the mold resin employed for the resin sealing body 14, the thermal expansion coefficient in a low temperature region of—55° C. is 10 to 18 ppm, and the Young's modulus is 10 to 20 GPa.

In the meantime, in a CSP package of flip chip type, when a package is damped, water accumulates on the under-fill resin sheet 12. However, in the CSP package of flip chip type having a conventional structure, as shown in FIG. 12, there is no effective discharge path of the accumulated water to the outside. Thus, when re-flow is applied, a crack occurs with the under-fill resin sheet 12, and re-flow properties are degraded by the action of the water accumulated by the under-fill resin sheet 12. However, as in the present embodiment, when the size of the under-fill resin sheet 12 is the same as the size (package size) of the resin sealing body 14, the end side face of the under-fill resin sheet 12 is exposed to the outside. As a result, as shown in FIG. 7, when re-flow is applied, the water accumulated by the under-fill resin sheet is effectively discharged to the outside from the end side face of the under-fill resin sheet 12 exposed to the outside. As a result, a quantity of water contained in the under-filling sheet is decreased, resulting in improved re-flow resistance.

Figure 8:
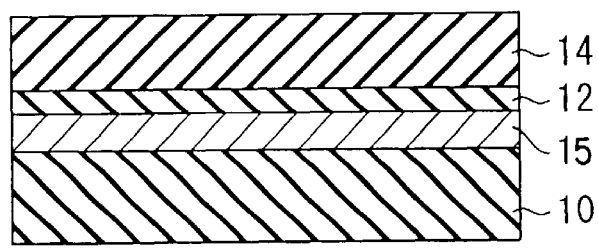
FIG. 8 is an enlarged cross section showing a portion of the semiconductor apparatus of FIG. 1 according to the present invention.

FIG. 8 is an enlarged sectional view showing a portion of the semiconductor apparatus shown in FIG. 1.

The chip 11 is pasted on the polyimide film 10 that is a wiring substrate by means of the under-fill resin sheet 12, and electrical connection between the chip 11 and the polyimide film 10 is made by flip chip connection. Then, the chip 11 and the polyimide film 10 are sealed by the resin sealing body 14 made of a mold resin.

With respect to the physical properties of the under-fill resin sheet 12, the thermal expansion coefficient in a low temperature region of—55° C. is 30 to 100 ppm, and the Young's modulus is 1.0 to 5.4 GPa. With respect to the physical properties of the mold resin employed for the resin sealing body 14, the thermal expansion coefficient in a low temperature region of—55° C. is 10 to 18 ppm, and the Young's modulus is 10 to 20 GPa.

Since an adhesion between Cu and a mold resin is poor, in a CSP package of a conventional flip chip type shown in FIG. 13 in which Cu and the mold resin employed as a wire are in direct contact with each other, there is a tendency that the mold resin easily separates from the Cu wire. In the present embodiment, as shown in FIG. 8, an under-fill resin sheet 12 is interposed between the wire 15 and the mold resin 14 formed at the polyimide film 10. The under-fill resin sheet 12 is characterized in that the elasticity is lower than that of the mold resin 14, and shock is easily absorbed in addition to the roles of an essential adhesive, and serves as a shock absorption body. Therefore, the presence of the under-fill resin sheet 12 has two roles, i.e., a role of adhesive and a role of shock absorbing, thereby making it difficult to for the wire 16 to separate from the mold resin 14.

Now, a semiconductor apparatus according to a second embodiment of the present invention will be described with reference to FIG. 9A and FIG. 9B.

Figure 9A:
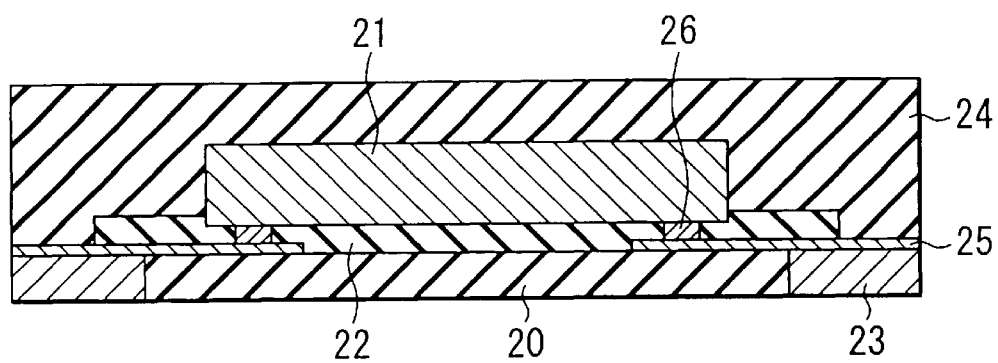
FIG. 9A and FIG. 9B are a sectional view and a plan view of the semiconductor apparatus according to a second embodiment of the present invention.
Figure 9B:
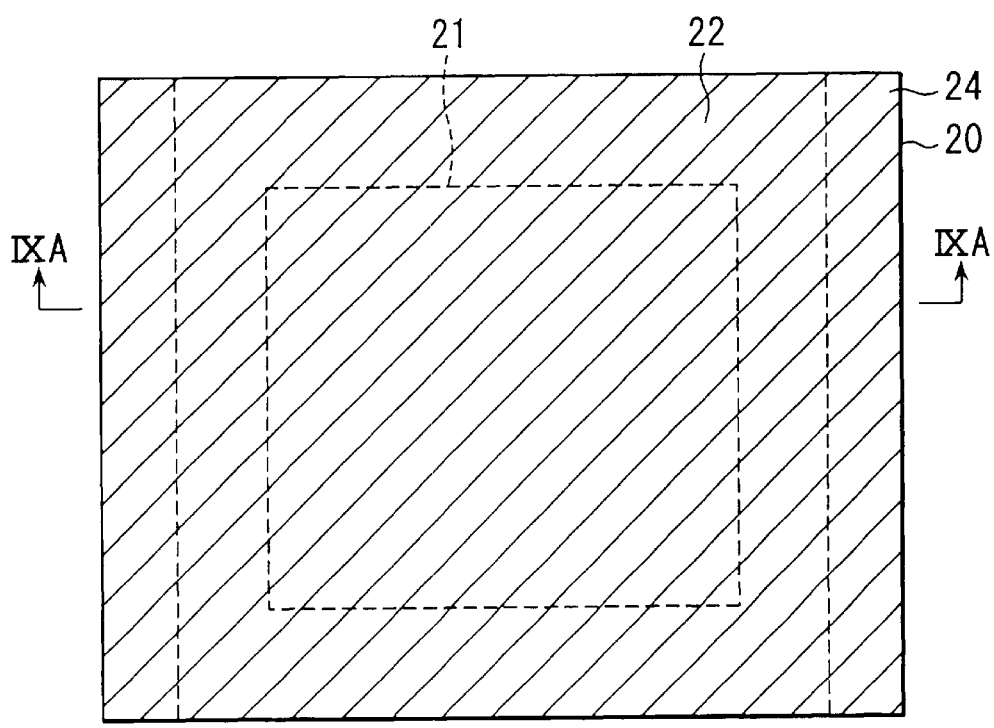

FIG. 9A and FIG. 9B are a sectional view and a perspective plan view of the semiconductor apparatus according to the second embodiment of the present invention. The sectional view of FIG. 9B indicates a portion taken along the line IXB—IXB of the plan view shown in FIG. 9A.

As a wiring substrate 20, there is employed an interposer made of a polyimide film (insulation film). A wiring layer 25 such as Cu is provided on the surface of the polyimide film 20. The chip 21 is disposed on the polyimide film 20, and is flip chip connected to the polyimide film 20. That is, a connection electrode 26 formed on the lower face of the chip 21, and electrically connected to its internal circuit (not shown), is connected to the wiring layer 25 formed on the surface of the polyimide film 20. An under-fill resin sheet 22 made of an epoxy resin or the like is provided between the chip 21 and the polyimide film 20, and a space between them is sealed from the outside. A resin sealing body 24 made of a mold resin such as epoxy resin is provided at the entire chip, and the entire chip is sealed from the outside. That is, the resin sealing body 24 made of a mold resin is provided on the chip 21 and on the under-fill resin sheet 22, and the entire chip is sealed from the outside.

The size of the under-fill resin sheet 22 is greater than that of the chip 21. In addition, as described above, the entire chip is sealed by the resin sealing body 24 made of a mold resin such as epoxy resin formed to be covered on the polyimide film 20. A space between the chip 21 and the polyimide film 20 is sealed with an under-fill resin sheet 22 made of an epoxy resin.

In the present embodiment, the under-fill resin sheet 22 is smaller than the resin sealing body 24 in area, and its end is exposed from the opposite two side faces (two left and right side faces in FIG. 9B), and is not exposed from the other opposite two side faces (two top and bottom side faces in FIG. 9B).

As in the present embodiment, even if only part of the side face is exposed at the end of the under-fill resin sheet 22, as long as a quantity of water of the under-fill resin sheet escaping to the outside is sufficiently ensured, an advantageous effect of the present invention can be provided. The size of the under-fill resin sheet 22 is smaller than that of the resin sealing body 24. The stress applied to a solder terminal 23 (FIG. 9A) is small, making it hard for a wire to separate a mold resin.

A semiconductor apparatus according to the third embodiment of the present invention will be described with reference to FIG. 18.

Figure 18:
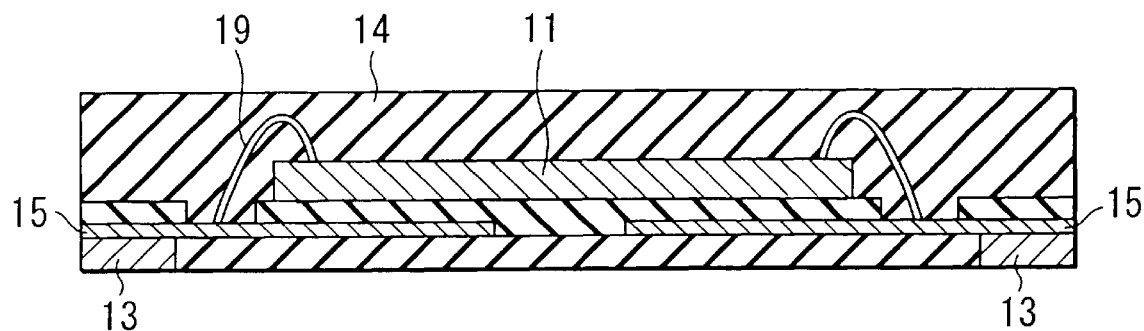
FIG. 18 is a sectional view of a semiconductor apparatus according to a third embodiment of the present invention.

FIG. 18 is a sectional view showing a semiconductor apparatus according to the third embodiment of the present invention.

The semiconductor apparatus according to the present embodiment is directed to a semiconductor apparatus of a wire bonding type. In the present embodiment, the chip and wire are connected via a bonding wire. The other configuration is similar to that in the present embodiment shown in FIG. 1. Like elements are designated by like reference numbers, and a detailed description thereof will be omitted. In the present embodiment as well, an advantageous effect similar to that obtained in the embodiment shown in FIG. 1 can be achieved.

A semiconductor apparatus according to a fourth embodiment of the present invention will be described with reference to FIG. 19.

Figure 19:
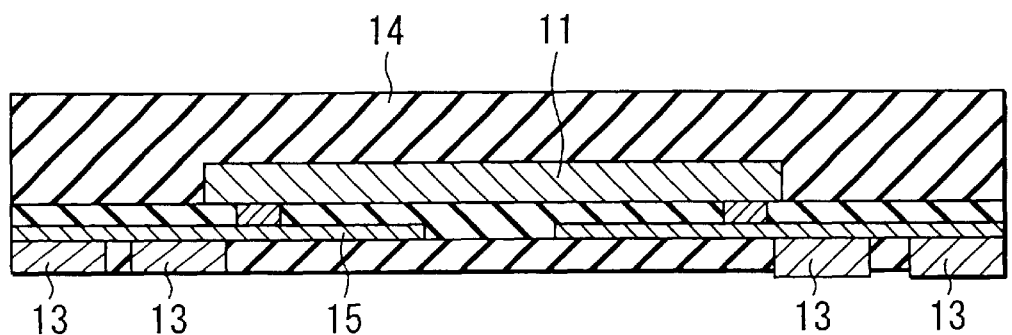
FIG. 19 is a sectional view of a semiconductor apparatus according to a fourth embodiment of the present invention.

FIG. 19 is a sectional view showing a semiconductor apparatus according to the fourth embodiment of the present invention.

The semiconductor apparatus according to the present embodiment is directed to a semiconductor apparatus whose external terminal is of an area type. In the present embodiment, the external terminal is disposed in an area type. The other configuration is similar to that in the present embodiment shown in FIG. 1. Like elements are designated by like reference numbers, and a detailed description thereof will be omitted. In the present embodiment as well, an advantageous effect similar to that obtained in the embodiment shown in FIG. 1 can be provided.

In the present invention, a resin under-fill resin sheet is interposed between a terminal portion of a wiring substrate and a mold, whereby the stress applied to the solder portion is reduced, and the reliability, due to the mount TCT, is improved. In addition, the under-fill resin sheet is greater than the chip in size, and its end is formed in a substantially identical size so as to be exposed from at least one side face, whereby a quantity of the water contained in this under-fill resin sheet can be reduced. As a result, re-flow resistance is improved. Further, an under-fill resin sheet is interposed between a Cu wire on a wiring substrate and a mold resin. As a result, it is difficult for the Cu wire to separate from a mold resin due to an under-fill resin sheet adhesive action and a shock absorption action.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor apparatus comprising:
   a semiconductor chip;
   a wiring substrate having said semiconductor chip mounted thereon;
   an under-fill resin sheet interposed between said semiconductor chip and said wiring substrate; and
   a resin sealing body for sealing said semiconductor chip, said under-fill resin sheet and said wiring substrate,
      wherein said under-fill resin sheet is greater than said semiconductor chip in size, and an end of said under-fill resin sheet is exposed from at least one side face of said resin sealing body.

2. A semiconductor apparatus according to claim 1, wherein said semiconductor chip is flip chip connected to said wiring substrate.

3. A semiconductor apparatus according to claim 1, wherein said under-fill resin sheet has a thermal expansion coefficient of 30 to 100 pp in a low temperature region of—55° C. and has a Young's modulus of 1.0 to 5.4 GPa.

4. A semiconductor apparatus according to claim 2, wherein said under-fill resin sheet has a thermal expansion coefficient of 30 to 100 pp in a low temperature region of—55° C. and has a Young's modulus of 1.0 to 5.4 GPa.

5. A semiconductor apparatus according to claim 1, wherein said resin sealing body has a thermal expansion coefficient of 10 to 18 ppm in a low temperature region of—55° C., and has a Young's modulus of 10 to 20 GPa.

6. A semiconductor apparatus according to claim 2, wherein said resin sealing body has a thermal expansion coefficient of 10 to 18 ppm in a low temperature region of—55° C., and has a Young's modulus of 10 to 20 GPa.

7. A semiconductor apparatus according to claim 3, wherein said resin sealing body has a thermal expansion coefficient of 10 to 18 ppm in a low temperature region of—55° C, and has a Young's modulus of 10 to 20 GPa.

8. A semiconductor apparatus according to claim 1, wherein a Young's modulus of said under-fill resin sheet is smaller than that of said resin sealing body.

9. A semiconductor apparatus according to claim 2, wherein a Young's modulus of said under-fill resin sheet is smaller than that of said resin sealing body.

10. A semiconductor apparatus according to claim 1, wherein said under-fill resin sheet is exposed at its end from four side faces of said resin sealing body.

11. A semiconductor apparatus according to claim 2, wherein-said under-fill resin sheet is exposed at its end from four side faces of said resin sealing body.

12. A semiconductor apparatus according to claim 1, wherein said under-fill resin sheet is exposed at its end from two opposite side faces of said resin sealing body, and is not exposed from the other opposite two side faces.

13. A semiconductor apparatus according to claim 2, wherein said under-fill resin sheet is exposed at its end from two opposite side faces of said resin sealing body, and is not exposed from the other opposite two side faces.

14. A semiconductor apparatus according to claim 1, wherein said wiring substrate is made of a polyimide film.

15. A semiconductor apparatus according to claim 2, wherein said wiring substrate is made of a polyimide film.

16. A semiconductor apparatus according to claim 1, wherein said wiring substrate is made of glass epoxy.

17. A semiconductor apparatus according to claim 2, wherein said wiring substrate is made of glass epoxy.

18. A semiconductor apparatus according to claim 1, wherein said under-fill resin sheet is made of an epoxy resin.

19. A semiconductor apparatus according to claim 2, wherein said under-fill resin sheet is made of an epoxy resin.

20. A semiconductor apparatus according to claim 1, wherein said semiconductor apparatus comprises a mount substrate having said semiconductor chip, said underfill resin sheet, said wiring substrate, and said resin sealing body mounted thereon.

21. A semiconductor apparatus according to claim 2, wherein said semiconductor apparatus comprises a mount substrate having said semiconductor chip, said underfill resin sheet, said wiring substrate, and said resin sealing body mounted thereon.

22. A semiconductor apparatus according to claim 20, further comprising an external terminal interposed between said under-fill resin sheet and said mount substrate.

23. A semiconductor apparatus according to claim 21, further comprising an external terminal interposed between said under-fill resin sheet and said mount substrate.

24. A semiconductor apparatus according to claim 22, wherein said external terminal is made of a solder.

25. A semiconductor apparatus according to claim 23, wherein said external terminal is made of a solder.

26. A semiconductor apparatus according to claim 1, wherein said semiconductor chip is connected to said wiring substrate by a bonding wire.

27. A semiconductor apparatus according to claim 26, wherein said under-fill resin sheet has a thermal expansion coefficient of 30 to 100 pp in a low temperature region of—55° C. and has a Young's modulus of 1.0 to 5.4 GPa.

28. A semiconductor apparatus according to claim 26, wherein said resin sealing body has a thermal expansion coefficient of 10 to 18 ppm in a low temperature region of—55° C., and has a Young's modulus of 10 to 20 GPa.

29. A semiconductor apparatus according to claim 26, wherein a Young's modulus of said under-fill resin sheet is smaller than that of said resin sealing body.

30. A semiconductor apparatus according to claim 26, wherein said under-fill resin sheet is exposed at its end from four side faces of said resin sealing body.

31. A semiconductor apparatus according to claim 26, wherein said under-fill resin sheet is exposed at its end from two opposite side faces of said resin sealing body, and is not exposed from the other opposite two side faces.

32. A semiconductor apparatus according to claim 26, wherein said wiring substrate is made of a polyimide film.

33. A semiconductor apparatus according to claim 26, wherein said wiring substrate is made of glass epoxy.

34. A semiconductor apparatus according to claim 26, wherein said under-fill resin sheet is made of an epoxy resin.

35. A semiconductor apparatus according to claim 26, wherein said semiconductor apparatus comprises a mount substrate having said semiconductor chip, said under-fill resin sheet, said wiring substrate, and said resin sealing body mounted thereon.

36. A semiconductor apparatus according to claim 35, further comprising an external terminal interposed between said under-fill resin sheet and said mount substrate.

37. A semiconductor apparatus according to claim 36, wherein said external terminal is made of a solder.

38. A semiconductor apparatus according to claim 20, further comprising external terminals arranged in an area type and interposed between said under-fill resin sheet and said mount substrate.

39. A semiconductor apparatus according to claim 21, further comprising external terminals arranged in an area type and interposed between said under-fill resin sheet and said mount substrate.

40. A semiconductor apparatus according to claim 38, wherein said external terminals are made of solder.

41. A semiconductor apparatus according to claim 39, wherein said external terminals are made of solder.

42. A semiconductor apparatus according to claim 35, further comprising external terminals arranged in an area type and interposed between said under-fill resin sheet and said mount substrate.

43. A semiconductor apparatus according to claim 42, wherein said external terminals are made of solder.

44. A method of manufacturing a semiconductor apparatus, comprising the steps of:
    providing an under-fill resin sheet of first physical properties on an insulation substrate that is a wiring substrate;
    providing a semiconductor chip on the under-fill resin sheet disposed on the insulation substrate;
    providing a resin sealing body of second physical properties different from the first physical properties on said insulation substrate so as to cover at least a part of the semiconductor chip and said under-fill resin sheet; and
    cutting in units of semiconductor chips a laminate body of said resin sealing body, said sheet, and said insulation substrate so that the end of said sheet is exposed from at least one side face of said resin sealing body.

45. A semiconductor apparatus manufacturing method according to claim 44, wherein said under-fill resin sheet is great as compared with said semiconductor chip in size.

46. A semiconductor apparatus manufacturing method according to claim 44, wherein said under-fill resin sheet is exposed at its end from four side faces of resin sealing body.

47. A semiconductor apparatus manufacturing method according to claim 45, wherein said under-fill resin sheet is exposed at its end from four side faces of resin sealing body.

48. A semiconductor apparatus manufacturing method according to claim 44, wherein said under-fill resin sheet is exposed at its end from opposite two side faces of said resin sealing body, and is not exposed from the other opposite two side faces.

49. A semiconductor apparatus manufacturing method according to claim 45, wherein said under-fill resin sheet is exposed at its end from opposite two side is faces of said resin sealing body, and is not exposed from the other opposite two side faces.

* * * * *

UNITED STATES PATENT AND TRADEMARK OFFICE
CERTIFICATE OF CORRECTION

PATENT NO. : 6,469,373 B2
DATED : October 22, 2002
INVENTOR(S) : Funakura et al.

It is certified that error appears in the above-identified patent and that said Letters Patent is hereby corrected as shown below:

Column 12,
Lines 37 and 41, "of—55° C." should read -- of -55° C. --.
Lines 45 and 49, "of—55° C.," should read -- of -55° C., --.
Line 53, "of—55° C," should read -- of -55° C., --.
Line 64, "wherein-said" should read -- wherein said --.

Column 13,
Lines 21 and 26, "underfill" should read -- under-fill --.
Line 45, "of—55° C." should read -- of -55° C. --.
Line 49, "of—55° C.," should read -- of -55° C., --.

Column 14,
Line 61, after "side" delete "is".

Signed and Sealed this

First Day of July, 2003

JAMES E. ROGAN
*Director of the United States Patent and Trademark Office*